US009450542B2

(12) United States Patent
Mita et al.

(10) Patent No.: US 9,450,542 B2
(45) Date of Patent: Sep. 20, 2016

(54) PREAMPLIFIER, OPTICAL RECEIVER, OPTICAL TERMINATION DEVICE, AND OPTICAL COMMUNICATION SYSTEM

(71) Applicants: Daisuke Mita, Chiyoda-ku (JP); Masaki Noda, Chiyoda-ku (JP); Masamichi Nogami, Chiyoda-ku (JP)

(72) Inventors: Daisuke Mita, Chiyoda-ku (JP); Masaki Noda, Chiyoda-ku (JP); Masamichi Nogami, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 14/413,483

(22) PCT Filed: Jan. 16, 2013

(86) PCT No.: PCT/JP2013/050660
§ 371 (c)(1),
(2) Date: Jan. 8, 2015

(87) PCT Pub. No.: WO2014/112051
PCT Pub. Date: Jul. 24, 2014

(65) Prior Publication Data
US 2015/0207469 A1 Jul. 23, 2015

(51) Int. Cl.
*H03F 3/08* (2006.01)
*H03G 3/30* (2006.01)

(52) U.S. Cl.
CPC .............. *H03F 3/08* (2013.01); *H03G 3/3084* (2013.01)

(58) Field of Classification Search
CPC ............................... H03F 3/08; H03G 3/3084

USPC ........................................ 250/214 A, 214 AG
See application file for complete search history.

(56) References Cited

U.S. PATENT DOCUMENTS 6,292,058 B1 * 9/2001 Ide .......................... H03K 5/082
330/136

FOREIGN PATENT DOCUMENTS

| JP | 10-242774 | 9/1998 |
| JP | 2003-264434 | 9/2003 |
| JP | 2004-260396 | 9/2004 |
| JP | 2007-174440 | 7/2007 |
| JP | 2007-274032 | 10/2007 |
| JP | 2009-049488 | 3/2009 |

OTHER PUBLICATIONS

International Search Report issued Apr. 2, 2013 in PCT/JP13/050660 filed Jan. 16, 2013.

* cited by examiner

*Primary Examiner* — Thanh Luu
(74) *Attorney, Agent, or Firm* — Oblon, McClelland, Maier & Neustadt, L.L.P (57) ABSTRACT

A current bypass circuit that passes part of a photocurrent output from a photodetector is connected to an input terminal of a current-to-voltage conversion amplifier circuit. A voltage obtained by level conversion of an output voltage by a voltage level conversion circuit is input into the current bypass circuit so that the current bypass circuit is turned on at a photocurrent that is smaller than the photocurrent at which a diode connected in parallel to a feedback resistor of the current-to-voltage conversion amplifier circuit is turned on. Consequently, the current-to-voltage conversion gain is switched in three stages according to the intensity of the photocurrent corresponding to an optical signal level.

12 Claims, 10 Drawing Sheets

PREAMPLIFIER, OPTICAL RECEIVER, OPTICAL TERMINATION DEVICE, AND OPTICAL COMMUNICATION SYSTEM

TECHNICAL FIELD

The present disclosure relates to a preamplifier, an optical receiver, an optical line terminating apparatus, and an optical communication system.

BACKGROUND ART

Recently, in access networks for providing multimedia service to respective homes, point to multi-point access optical communication systems called passive optical network (PON) systems realized by a public network using optical fiber are being broadly used.

A PON system is constituted by one optical line terminal (OLT) which is a station-side apparatus, and multiple optical network units (ONUs), which are termination devices for subscribers, connected via optical star couplers. This is advantageous because, since most of the optical fiber connecting medium and the OLT may be shared by multiple ONUs, a reduction in operating costs can be expected, and since there is no need to supply power to the optical star coupler, which is a passive component, outdoor installation is easy, and reliability is high. Given these advantages, PON systems are actively being introduced as optical communication systems that realize broadband networks.

In such a PON system, since each ONU is positioned at a different distance from the OLT, at the OLT the optical signal levels of the optical signals transmitted from each of the ONUs differ for each received packet that the OLT receives from each ONU. Consequently, wide dynamic range that consistently reproduces packets at different optical signal levels is demanded of the optical receiver in the OLT. A preamplifier installed in the optical receiver is typically equipped with an automatic gain control (AGC) circuit in order to realize wide dynamic range.

For example, in the optical receiving device disclosed in Patent Literature 1, the conversion gain of a preamplifier is actively switched per packet. However, such a method requires components such as a selecting circuit that selects a feedback resistor for setting the conversion gain to an optimal value according to the optical signal level, and the circuit size is increased. Furthermore, since switching is conducted per packet, converging onto an optimal conversion gain takes time.

In contrast, the optical receiver disclosed in Patent Literature 2, for example, passively varies the conversion gain of a preamplifier according to the optical signal level. Namely, the conversion gain is passively varied according to the intensity of a photocurrent converted by a photodetector. Specifically, the preamplifier of the optical receiver is equipped with a current-to-voltage conversion circuit that converts a photocurrent corresponding to the optical signal level into a voltage signal. The current-to-voltage conversion circuit includes an amplifier and a feedback resistor. A diode or the like is connected in parallel to the feedback resistor of the current-to-voltage conversion circuit.

In such an optical receiver, when the optical signal level rises and the photocurrent generated by the photodetector increases, the voltage drop across the feedback resistor increases, and the input/output voltage difference of the current-to-voltage conversion circuit increases. Subsequently, when the input/output voltage difference of the current-to-voltage conversion circuit exceeds the threshold voltage of the diode, current flows in the diode, and the overall resistance of the feedback resistor and the diode connected in parallel decreases. Consequently, since the conversion gain of the current-to-voltage conversion circuit decreases, passively varying the conversion gain according to the photocurrent becomes possible.

In other words, when a photocurrent is large, by passing most of the photocurrent to the diode having an approximately constant voltage drop, the voltage drop produced at the feedback resistor is moderated, and a received signal that is a voltage signal can be output even for input light with a high optical signal level, thereby realizing wide dynamic range. Also, since the preamplifier of Patent Literature 2 can conduct AGC operation per 1 bit of an optical digital signal, high-speed operation becomes possible.

CITATION LIST

Patent Literature

Patent Literature 1: Unexamined Japanese Patent Application Kokai Publication No. 2004-260396
Patent Literature 2: Unexamined Japanese Patent Application Kokai Publication No. 2007-274032

SUMMARY OF INVENTION

Technical Problem

In the preamplifier of the optical receiver according to Patent Literature 2, when the input photocurrent is small, the diode turns off, and almost all of the photocurrent flows to the feedback resistor of the current-to-voltage conversion circuit. For this reason, the output voltage varies linearly with respect to variation in the photocurrent. At this point, the slope of a straight line indicating the relationship of the output voltage versus the photocurrent is negative, so that when the photocurrent is at high level, Hi level, the output voltage goes to low level, Lo level.

Conversely, when the input photocurrent is large, the diode turns on, and the photocurrent higher than a certain level flows to the diode. For this reason, the output voltage of the current-to-voltage conversion circuit is clipped at a fixed value. Consequently, the output voltage when the photocurrent of an optical digital signal is at Hi level does not drop sufficiently. Consequently, there is a problem in that the cross-point between the rise and fall of the signal drops, the waveform of the received signal is degraded, and distortion increases.

The present disclosure has been written in light of the above circumstances, and takes as an objective to provide a preamplifier and the like that reduces the waveform distortion of a voltage signal, the voltage signal being output by performing current-to-voltage conversion of an input current.

Solution to Problem

In order to achieve the above objective, a preamplifier according to the present disclosure is configured to include:
a current-to-voltage conversion amplifier circuit that converts all or part of a signal current into a signal voltage, and also amplifies and outputs the signal voltage;
gain varying means that varies a conversion gain of the current-to-voltage conversion amplifier circuit so that the conversion gain has a point of variation when an input current is equal to a first threshold value;

a current bypass circuit that bypasses part of the signal current according to the intensity of the signal current; and a voltage level conversion circuit that outputs to the current bypass circuit a level-converted voltage obtained by level conversion of the signal voltage at a predetermined ratio;

wherein a second threshold value, which is the intensity of the input current of the current-to-voltage conversion amplifier circuit when the level-converted voltage output from the voltage level conversion circuit becomes a voltage of a threshold value for switching between whether or not to execute a bypass of the current bypass circuit, is less than the first threshold value.

Advantageous Effects of Invention

According to the present disclosure, it is possible to reduce the waveform distortion of a voltage signal output by performing current-to-voltage conversion of an input current.

DESCRIPTION OF EMBODIMENTS

Embodiment 1

Embodiment 1 of the present disclosure will be described in detail with reference to the drawings.

Figure 1:
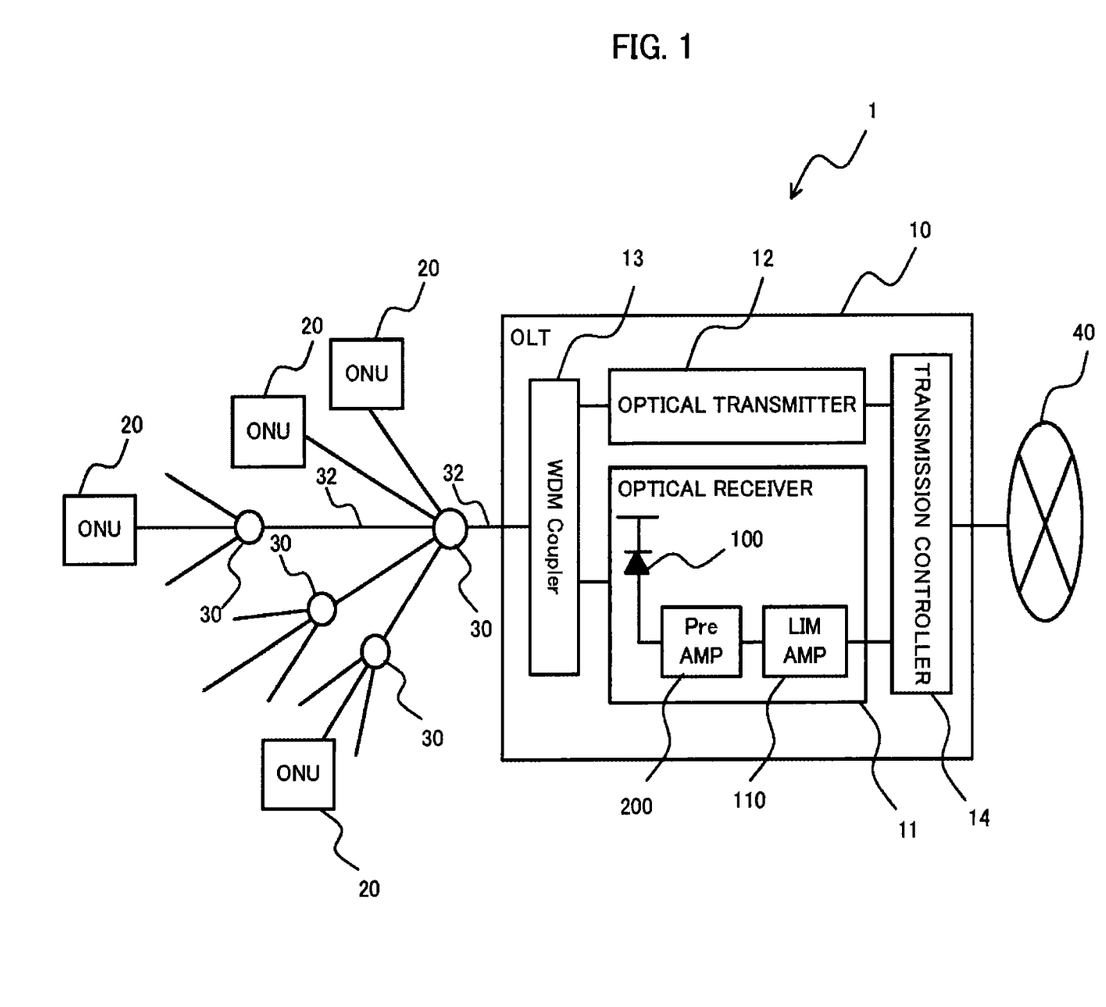
FIG. 1 is a block diagram illustrating a configuration of an optical communication system according to an embodiment.

The optical communication system 1 according to Embodiment 1 is a passive optical network (PON) system adopting a point to multi-point format. As illustrated in FIG. 1, the optical communication system 1 is equipped with one optical line terminal (OLT) 10, which is a station-side apparatus, multiple optical network units (ONUs) 20, which are subscriber-side termination devices, and optical star couplers 30 that passively split/couple optical signals. All ONUs 20 are connected to the OLT 10 via one or more optical star couplers 30 and optical fiber 32.

The OLT 10 includes an optical receiver 11, an optical transmitter 12, a wavelength-division multiplexing coupler 13, and a transmission controller 14. The wavelength-division multiplexing coupler 13 is for outputting uplink signals and downlink signals with different optical wavelengths in a predetermined direction. Optical signals output from the ONUs 20 and transmitted through the optical fiber 32 are output on the side of the optical receiver 11, and optical signals output from the optical transmitter 12 are output on the side of the optical fiber 32 connecting to the ONUs 20.

The transmission controller 14 generates a modulation signal and inputs the generated a modulation signal into the optical transmitter 12 based on a baseband signal input from an external network 40 such as the Internet. The optical transmitter 12 uses the modulation signal input from the transmission controller 14 to modulate light emitted by a light-emitting element such as a semiconductor laser. The modulated optical signal is output via the wavelength-division multiplexing (WDM) coupler 13 as a downlink signal, transmitted along the optical fiber 32, and optically received at each ONU 20.

The optical signal of an uplink signal transmitted from an ONU 20 and along the optical fiber 32 is input into the optical receiver 11 via the wavelength-division multiplexing coupler 13. The optical receiver 11 photoelectrically converts the input optical signal and demodulates the photoelectrically-converted input optical signal into a received signal of a voltage signal, and outputs the received signal to the transmission controller 14. The transmission controller 14 converts the input received signal into a baseband signal, and outputs the baseband signal to the external network 40.

Herein, the optical signal transmitted from each ONU 20 is a burst packet signal, and an optical signal that time-division multiplexes the burst packets is input into the OLT 10. Since each ONU 20 is connected to the OLT 10 via optical fiber 32 of arbitrary length and an arbitrary number of optical star couplers 30, the intensity of the optical signal that the optical receiver 11 of the OLT 10 optically receives differs greatly for each packet. In other words, in order to obtain a consistent received signal from such an optical signal, it is necessary to configure the optical receiver 11 to be able to accommodate a wide dynamic range.

The optical receiver 11 of the OLT 10 includes a photodetector 100, a preamplifier (Pre-AMP) 200, and a limiting amplifier (LIM-AMP) 110.

The photodetector 100 includes a photodiode or the like, and generates and outputs a photoelectric current corresponding to the intensity of an optically received optical signal, or in other words, the optical signal level. The preamplifier 200 converts a photocurrent input from the photodetector 100 into a received signal, which is a voltage signal, and additionally amplifies and outputs the received signal. The limiting amplifier 110 amplifies and limits the received signal input from the preamplifier 200 to a voltage signal having the predetermined intensity to output the signal.

Figure 2:
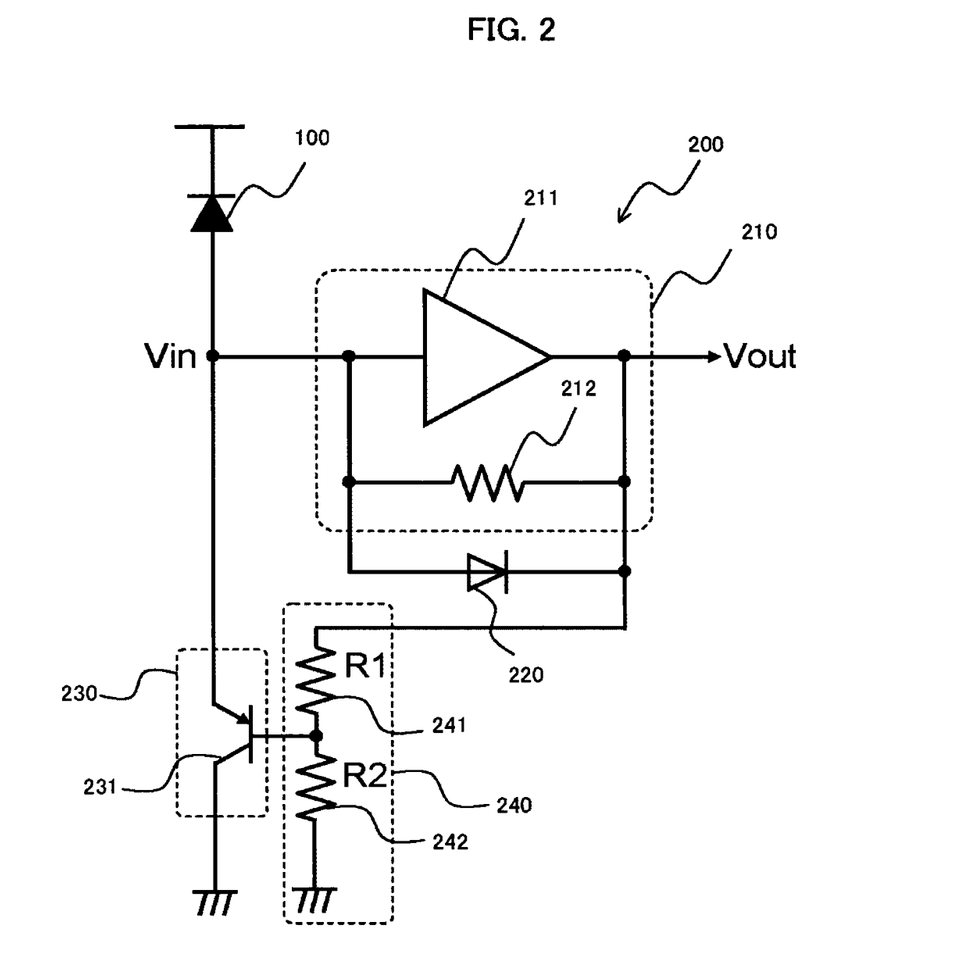
FIG. 2 is a diagram illustrating a circuit layout of a preamplifier of an optical receiver according to Embodiment 1.

The configuration and function of the preamplifier 200 will be described in detail using FIGS. 2 to 5. As illustrated in FIG. 2, the preamplifier 200 includes a current-to-voltage conversion amplifier circuit 210, a diode 220, a current bypass circuit 230, and a voltage level conversion circuit 240.

The current-to-voltage conversion amplifier circuit 210 includes an amplifier 211 such as an op-amp, and a feedback resistor 212 inserted between the input/output terminals of the amplifier 211. The output terminal of the photodetector 100 and the input terminal of the amplifier 211 are connected. The diode 220 is inserted between the input/output terminals of the amplifier 211. In other words, the diode 220 and the feedback resistor 212 are connected in parallel to each other.

The current bypass circuit 230 includes a PNP bipolar transistor 231 (hereinafter called the PNP transistor 231). The emitter terminal of the PNP transistor 231 is connected to the output terminal of the photodetector 100, and the collector terminal is grounded. The voltage level conversion circuit 240 includes a resistor 241 and a resistor 242 connected in series, and converts the voltage level by resistance voltage division. The resistance-divided voltage is input into the base terminal of the PNP transistor 231.

The preamplifier 200 configured as above switches operation according to whether the diode 220 is on or off, and whether the current bypass circuit 230 is on or off. The diode 220 turns on when the output voltage Vout of the amplifier 211 falls below a threshold voltage Vth1, and turns off when the output voltage Vout of the amplifier 211 is equal to or greater than the threshold voltage Vth1. Herein, since the output signal of the amplifier 211 is a square wave, for example, the output voltage Vout is the amplitude of the voltage signal.

The threshold voltage Vth1 is expressed by formula (1) below.

$$Vth1 = Vin - Vth3 \quad (1)$$

In formula (1), Vin is the input voltage of the amplifier, and Vth3 is a threshold voltage possessed by the diode 220.

The current bypass circuit 230 turns on when the output voltage Vout of the amplifier 211 falls below a threshold voltage Vth2, and turns off when the output voltage Vout of the amplifier 211 is equal to or greater than the threshold voltage Vth2. The threshold voltage Vth2 is expressed by formula (2) below.

$$Vth2 = (R1+R2)/R2 \times (Vin - Vth4) \quad (2)$$

In formula (2), Vin is the input voltage of the amplifier, Vth4 is a threshold voltage possessed by the PNP transistor 231, and R1 and R2 are the respective resistance values of the resistor 241 and the resistor 242.

Figure 3:
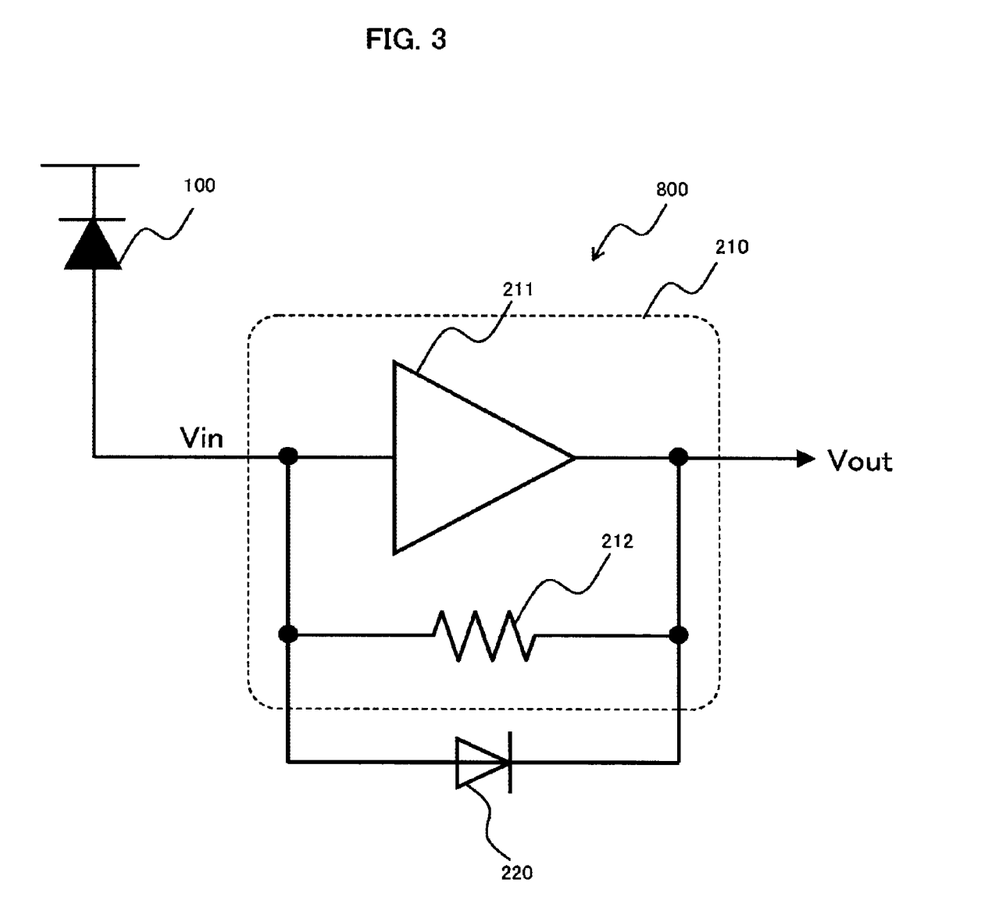
FIG. 3 is a diagram illustrating a circuit layout of a preamplifier of an optical receiver of the related art.

The operation of the preamplifier 200 will be described in comparison to the operation of a preamplifier 800 configured according to the related art. In the preamplifier 800 of the related art, the diode 220 is simply connected in parallel to the feedback resistor 212 as illustrated in FIG. 3, in a configuration that lacks the current bypass circuit of the preamplifier 200 according to the present embodiment.

Figure 4:
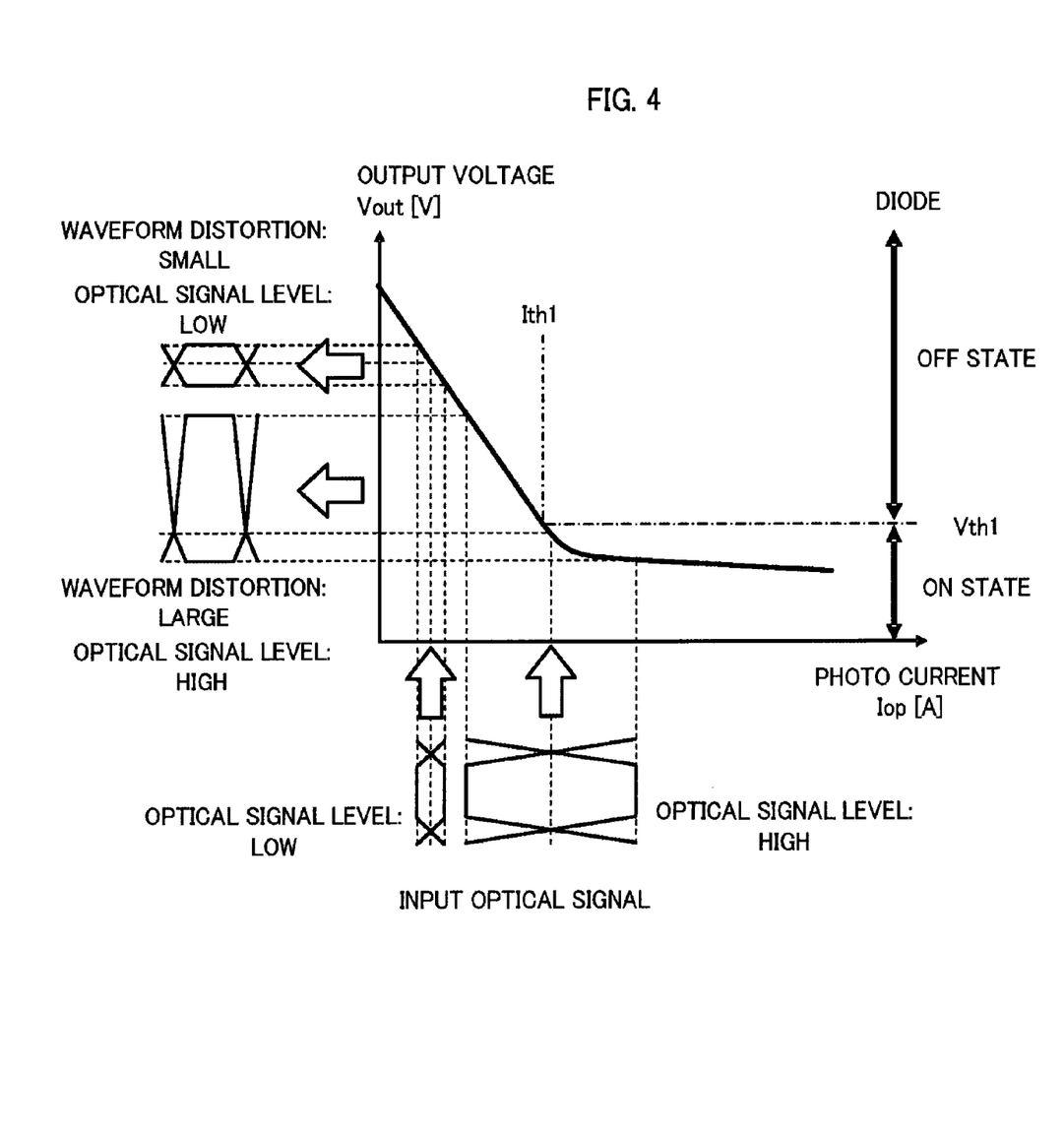
FIG. 4 is a diagram for explaining variation in output voltage versus photocurrent in a preamplifier of the related art.

FIG. 4 shows variation in output voltage versus input photocurrent in the preamplifier 800 of the related art. When the optical signal level is low and the photocurrent is small, the diode 220 turns off, and all photocurrent flows to the feedback resistor 212 of the current-to-voltage conversion amplifier circuit 210. For this reason, the output voltage varies linearly with respect to variations in photocurrent.

On the other hand, when the optical signal level is high and the photocurrent is large, the voltage drop across the feedback resistor 212 increases, and the output voltage Vout falls below the threshold voltage Vth1. For this reason, the diode 220 turns on, and part of the photocurrent flows to the diode 220. In other words, when the photocurrent Iop exceeds a threshold value Ith1, the voltage drop across the feedback resistor 212 with a resistance value R (R×Iop) exceeds the threshold voltage Vth3 of the diode 220. For this reason, the diode 220 turns on, and part of the photocurrent flows to the diode 220. Consequently, the output voltage Vout becomes clipped at a fixed value.

Note that in an actual circuit, in order to compensate the conversion gain when the diode 220 turns on, a compensating resistor is inserted in series with the diode 220, and a slight slope is induced in the photocurrent.

If a photocurrent photoelectrically converted from an input optical signal is input into a current-to-voltage conversion amplifier circuit 210 having the relationship between photocurrent and output voltage as illustrated in FIG. 4, when the optical signal level is low, a waveform similar to the waveform of the input optical signal with almost no distortion is output. On the other hand, when the optical signal level is high, the output voltage when the optical signal is at the 1 level does not drop sufficiently. Consequently, the cross-point between the rise and fall of the signal drops, the waveform of the received signal is degraded, and distortion increases.

Figure 5:
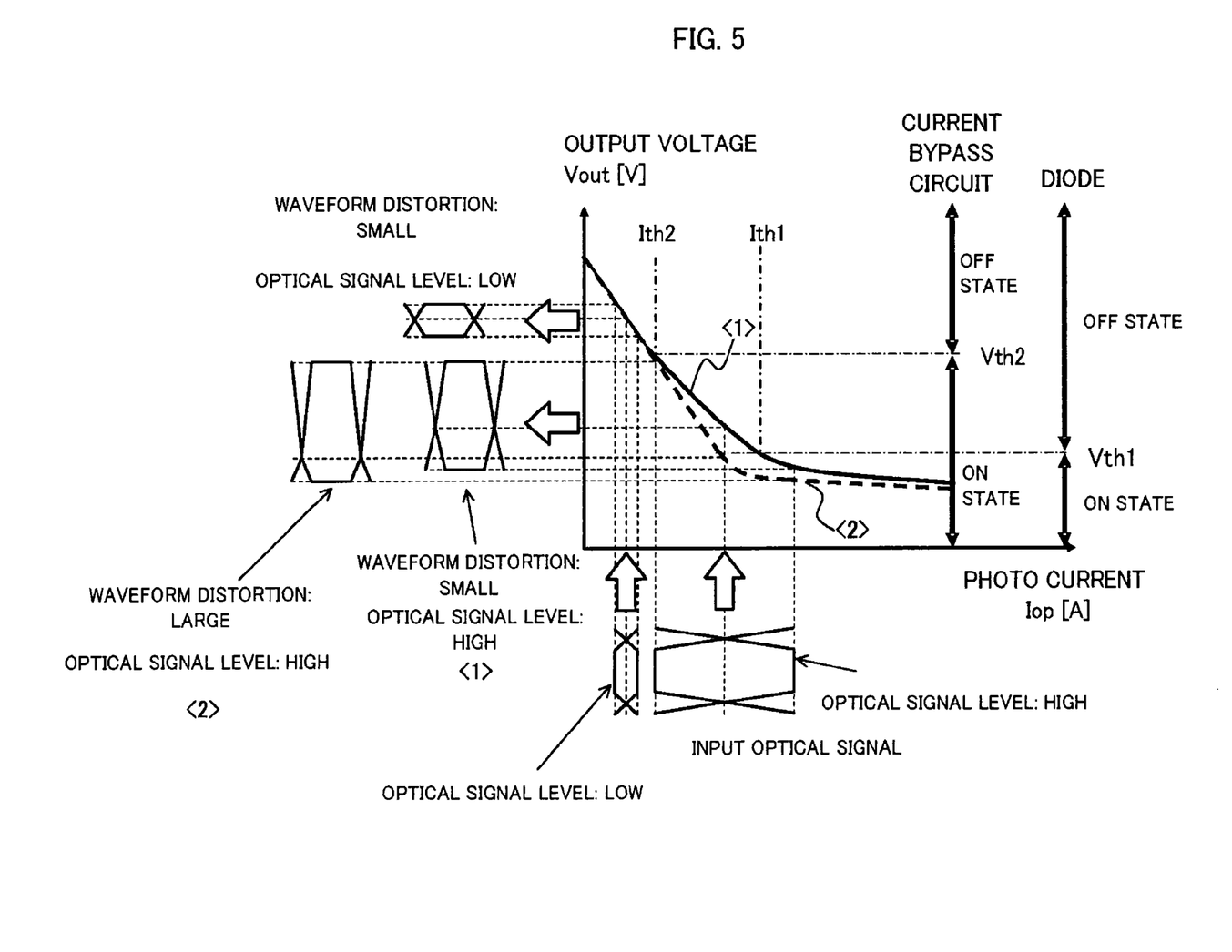
FIG. 5 is a diagram for explaining variation in output voltage versus photocurrent in a preamplifier according to Embodiment 1.

In contrast, the preamplifier 200 according to the present embodiment has a relationship between photocurrent and output voltage as illustrated in FIG. 5.

When the optical signal level is low and the photocurrent is small, the current bypass circuit 230 and the diode 220 turn off, and all photocurrent flows to the current-to-voltage conversion amplifier circuit 210, and particularly, most current flows to the feedback resistor 212. For this reason, the output voltage varies linearly with respect to variations in photocurrent.

As the optical signal level is high and the photocurrent increases, the voltage drop across the feedback resistor 212 increases, and the output voltage falls. If the photocurrent Iop exceeds a threshold value Ith2, the output voltage Vout falls below Vth2, the current bypass circuit 230 turns on, and part of the photocurrent input from the photodetector 100 flows to the current bypass circuit 230. Consequently, the current flowing into the feedback resistor 212 decreases, and the slope of the variation in the output voltage versus photocurrent increases. Also, by having the current bypass circuit 230 activated, the overall resistance value between the input/output of the current-to-voltage conversion amplifier circuit 210 becomes smaller, and the conversion gain of the preamplifier 200 becomes smaller.

Furthermore, when the optical signal level is high, the photocurrent Iop increases and exceeds Ith1, and the output voltage Vout falls below Vth1, the diode 220 turns on, and part of the photocurrent also flows to the diode 220. Consequently, the current flowing into the feedback resistor 212 decreases further, and the slope of the variation in the output voltage Vout versus the photocurrent Iop becomes even larger. Also, by having the diode 220 turn on, the overall resistance value between the input/output of the current-to-voltage conversion amplifier circuit 210 becomes smaller, and the conversion gain of the preamplifier 200 becomes even smaller.

Herein, the respective threshold voltages decided by formula (1) and formula (2) are required to satisfy formula (3) below.

$$Vth1 < Vth2 \quad (3)$$

Namely, the threshold voltage Vth2 at which the current bypass circuit 230 turns on is set higher than the threshold voltage Vth1 at which the diode 220 turns on. In other words, the current bypass circuit 230 is made to turn on at a lower optical signal level (intensity of photocurrent). Formula (3) when rewritten in terms of the relationship between photocurrent threshold values results in formula (4) below.

$$Ith1 > Ith2 \quad (4)$$

By giving the preamplifier 200 such a configuration, it becomes possible for the variation in output voltage versus photocurrent, or in other words, the current-to-voltage conversion gain, to have a three-stage slope (<1> in FIG. 5). According to this operation, it is possible to make the overall slope of the output voltage versus the photocurrent more linear compared to the configuration of the related art (<2> in FIG. 5), and it is possible to make the cross-point between the rise and fall of the signal of the output voltage be closer to the output voltage corresponding to the "0" levels of the photocurrent compared to the configuration of the related art. Consequently, improving waveform distortion becomes possible.

The operation of this preamplifier 200 is automatic gain control (AGC) operation, which passively varies the gain of the preamplifier 200 according to the intensity of the photocurrent. Thus, high-speed AGC operation per 1 bit is possible, and in addition, a reduction of waveform distortion may be achieved.

As described above, according to the present embodiment, there is provided a current bypass circuit 230 that passes part of the photocurrent output from the photodetector 100. A voltage obtained by the voltage level conversion circuit 240 performing level conversion on the output voltage is input into the current bypass circuit 230 so that the current bypass circuit 230 turns on at a photocurrent that is smaller than the photocurrent at which the diode 220 turns on. Further, the current-to-voltage conversion gain is switched in three stages according to the intensity of the photocurrent corresponding to the optical signal level. Consequently, it is possible to have a wide dynamic range that consistently reproduces packets at different optical signal levels, and a received signal with reduced waveform distortion can be output.

Embodiment 2

Embodiment 2 of the present disclosure will be described in detail with reference to the drawings.

The configuration of an optical communication system 1 and an OLT 10 in Embodiment 2 of the present disclosure is the same as that of Embodiment 1. Since the configuration of a preamplifier 300 provided in the optical receiver 11 of the OLT 10 differs from that of Embodiment 1, the configuration of the preamplifier 300 will be described using FIG. 6.

Figure 6:
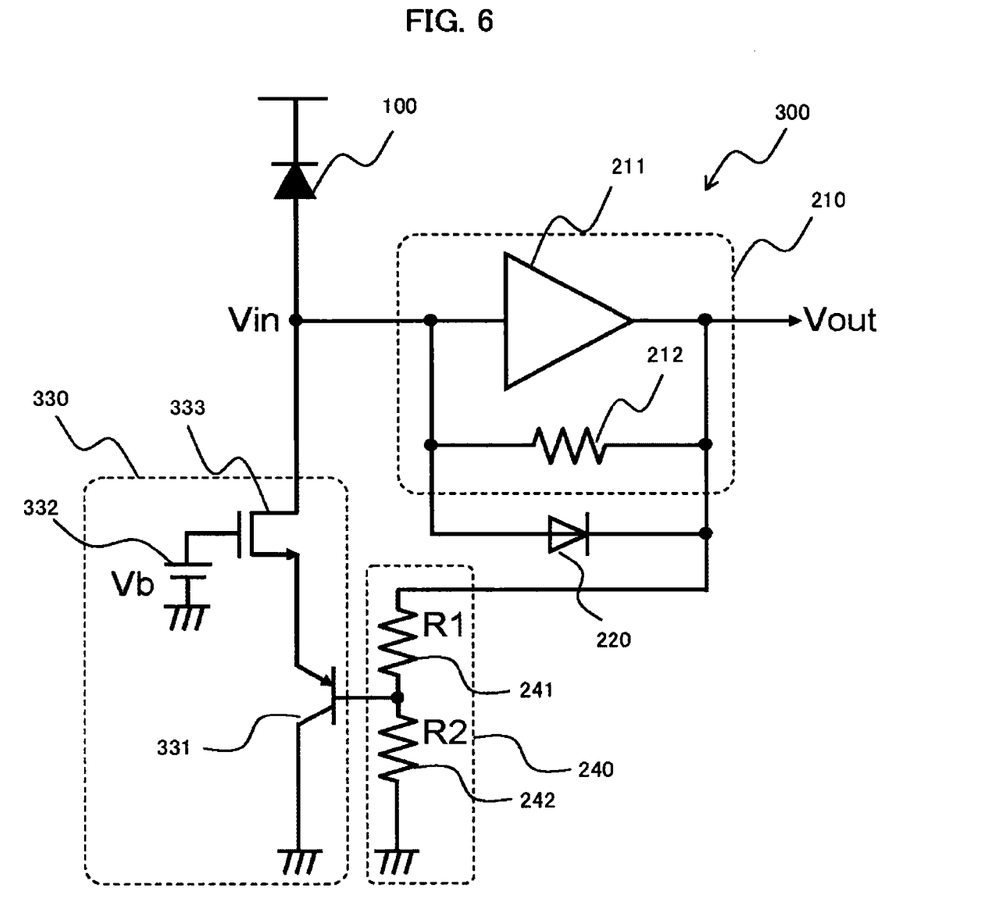
FIG. 6 is a diagram illustrating a circuit layout of a preamplifier of an optical receiver according to Embodiment 2.

As illustrated in FIG. 6, the preamplifier 300 includes a current-to-voltage conversion amplifier circuit 210, a diode 220, a current bypass circuit 330, and a voltage level conversion circuit 240. The configuration and functions of the current-to-voltage conversion amplifier circuit 210, the diode 220, and the voltage level conversion circuit 240 are similar to those of Embodiment 1.

The current bypass circuit 330 includes a PNP transistor 331, a bias power source 332, and an N channel metal-oxide-semiconductor field effect transistor (hereinafter called an NMOS) 333. The NMOS 333 is provided between the photodetector 100 and the PNP transistor 331, and a predetermined bias voltage is applied to the gate of the NMOS 333 by the bias power source 332.

In this way, by providing the NMOS 333 between the photodetector 100 and the PNP transistor 331, the input capacity of the current-to-voltage conversion amplifier circuit 210 can be moderated, and bandwidth constriction can be prevented. The NMOS 333 has a current-carrying capacity similar to that of the PNP transistor 331 from the relationship of carrier mobility, and can be realized in a small size.

The preamplifier 300 configured as above switches operation according to whether the diode 220 is on or off, and whether the current bypass circuit 330 is on or off. The diode 220 turns on when the output voltage Vout of the amplifier 211 falls below a threshold voltage Vth1, and turns off when the output voltage Vout of the amplifier 211 is equal to or greater than the threshold voltage Vth1. The threshold voltage Vth1 is expressed by formula (1) described earlier.

The current bypass circuit 330 turns on when the output voltage Vout of the amplifier 211 falls below a threshold voltage Vth5, and turns off when the output voltage Vout of the amplifier 211 is equal to or greater than the threshold voltage Vth5. The threshold voltage Vth5 is expressed by formula (5) below.

$$Vth5=(R1+R2)/R2\times\{Vb-(Vth51+Vth6)\} \quad (5)$$

Herein, Vb is the bias voltage value of the bias power source 332, Vth51 is a threshold voltage possessed by the NMOS 333, Vth6 is a threshold voltage possessed by the PNP transistor 331, and R1 and R2 are the respective resistance values of the resistor 241 and the resistor 242. When the output voltage Vout of the current-to-voltage conversion amplifier circuit 210 falls below Vth5, the current bypass circuit 330 turns on.

In formula (5), since the threshold voltages of the NMOS 333 and the PNP transistor 331 are nearly fixed values, it is possible to decide Vth5 depending on the bias voltage value Vb of the bias power source 332, and fine configuration may be conducted. In other words, providing the NMOS 333 also has the effect of giving a degree of freedom in the configuration of the threshold voltage Vth5 at which the current bypass circuit 330 turns on.

Herein, the respective threshold voltages decided by formula (1) and formula (5) are required to satisfy formula (6) below.

$$Vth1<Vth5 \quad (6)$$

Namely, the threshold voltage Vth5 at which the current bypass circuit 330 turns on is set higher than the threshold voltage Vth1 at which the diode 220 turns on. In other words, the current bypass circuit 330 is made to turn on at a lower optical signal level (intensity of photocurrent) than the diode 220.

By giving the preamplifier 300 such a configuration, similarly to Embodiment 1, it becomes possible for the variation in output voltage versus photocurrent, or in other words, the current-to-voltage conversion gain, to have a three-stage slope, and it becomes possible to make the overall slope of the variation in output voltage versus photocurrent more linear. Consequently, improving waveform distortion becomes possible.

As described above, according to the present embodiment, in the current bypass circuit 330 that passes part of the photocurrent output from the photodetector 100, an NMOS 333 having a gate terminal to which a bias voltage is applied by the bias power source 332 is provided between the photodetector 100 and the PNP transistor 331. Consequently, in addition to enabling a reduction of the waveform distortion of the received voltage, bandwidth constriction of the current-to-voltage conversion amplifier circuit 210 can be prevented, and by adjusting the bias voltage value, the threshold voltage Vth5 at which the current bypass circuit 330 turns on can be configured.

Embodiment 3

Embodiment 3 of the present disclosure will be described in detail with reference to the drawings.

The configuration of an optical communication system 1 and an OLT 10 in Embodiment 3 of the present disclosure is the same as that of Embodiment 1. Since the configuration of a preamplifier 400 provided in the optical receiver 11 of the OLT 10 differs from that of Embodiment 1, the configuration of the preamplifier 400 will be described using FIG. 7.

Figure 7:
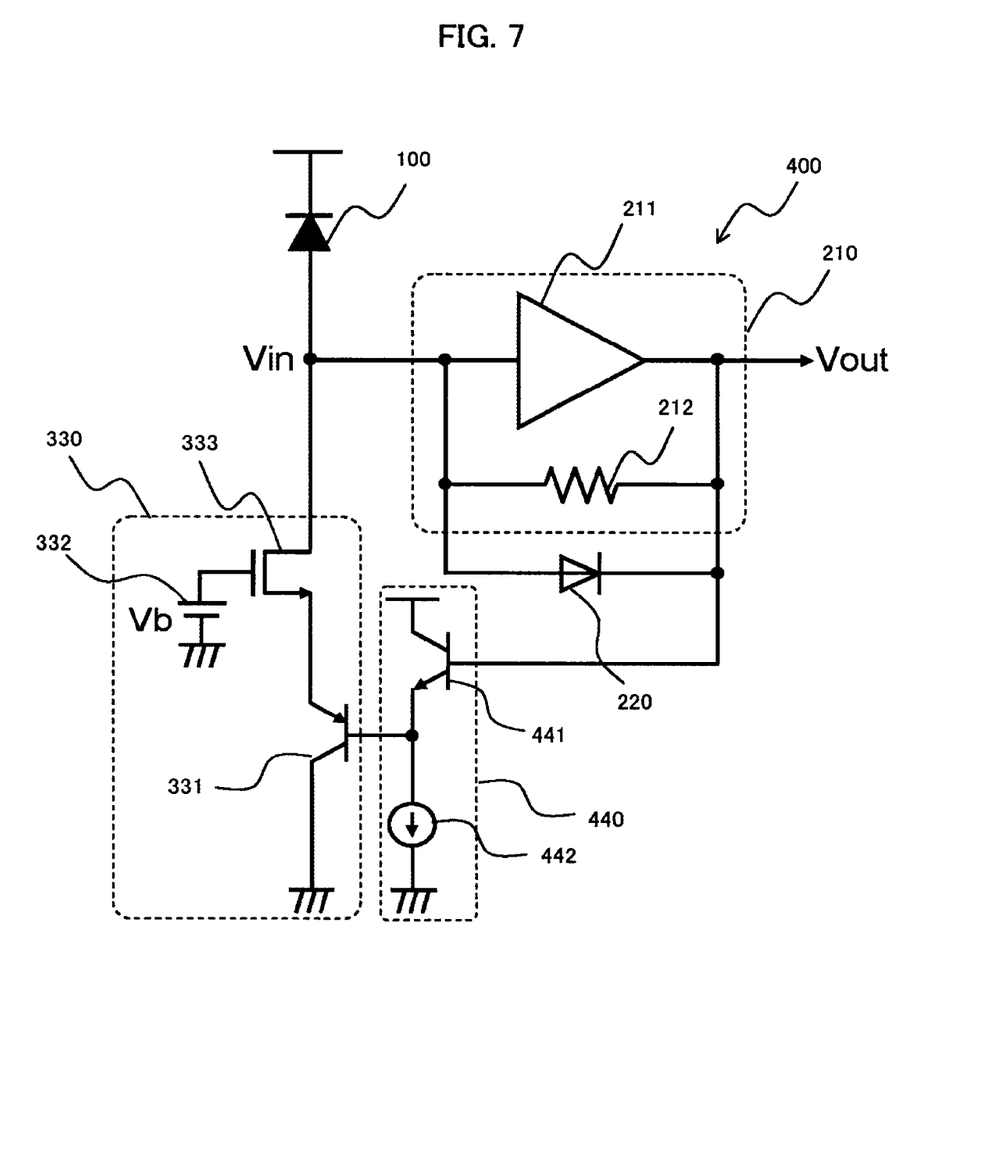
FIG. 7 is a diagram illustrating a circuit layout of a preamplifier of an optical receiver according to Embodiment 3.

As illustrated in FIG. 7, the preamplifier 400 includes a current-to-voltage conversion amplifier circuit 210, a diode 220, a current bypass circuit 330, and a voltage level conversion circuit 440. The configuration and functions of the current-to-voltage conversion amplifier circuit 210, the diode 220, and the current bypass circuit 330 are similar to those of Embodiment 1 or 2.

The voltage level conversion circuit 440 according to the present embodiment has a configuration in which an NPN bipolar transistor 441 (hereinafter called the NPN transistor 441) and a current source 442 are connected in series. The base terminal of the NPN transistor 441 is connected to the output terminal of the current-to-voltage conversion amplifier circuit 210, and accepts an input of the received signal that is the output voltage signal of the current-to-voltage conversion amplifier circuit 210.

By appropriately adjusting the configuration of the NPN transistor 441 and the current source 442, an effect similar to the resistance voltage division used by the voltage level conversion circuit 240 according to Embodiment 1 is obtained. A voltage obtained by level conversion of the output voltage Vout of the current-to-voltage conversion amplifier circuit 210 is input into the current bypass circuit 330, and the current bypass circuit 330 switches the bypass on/off based on the input voltage signal. Note that the NPN transistor 441 of the voltage level conversion circuit 440 may also be substituted with an NMOS.

As described above, according to the present embodiment, a voltage level conversion circuit 440 that generates a voltage to be input into the current bypass circuit 330 in order to switch the on/off state of the current bypass circuit 330 includes an NPN transistor 441 and a current source 442. Consequently, in the preamplifier 400, by appropriately adjusting the configuration of the NPN transistor 441 and the current source 442, the voltage output by the voltage level conversion circuit 440 can be adjusted, and as a result, the current bypass on/off threshold value can be adjusted.

Embodiment 4

Embodiment 4 of the present disclosure will be described in detail with reference to the drawings.

The configuration of an optical communication system 1 and an OLT 10 in Embodiment 4 of the present disclosure is the same as that of Embodiment 1. Since the configuration of a preamplifier 500 provided in the optical receiver 11 of the OLT 10 differs from that of Embodiment 1, the configuration of the preamplifier 500 will be described using FIG. 8.

Figure 8:
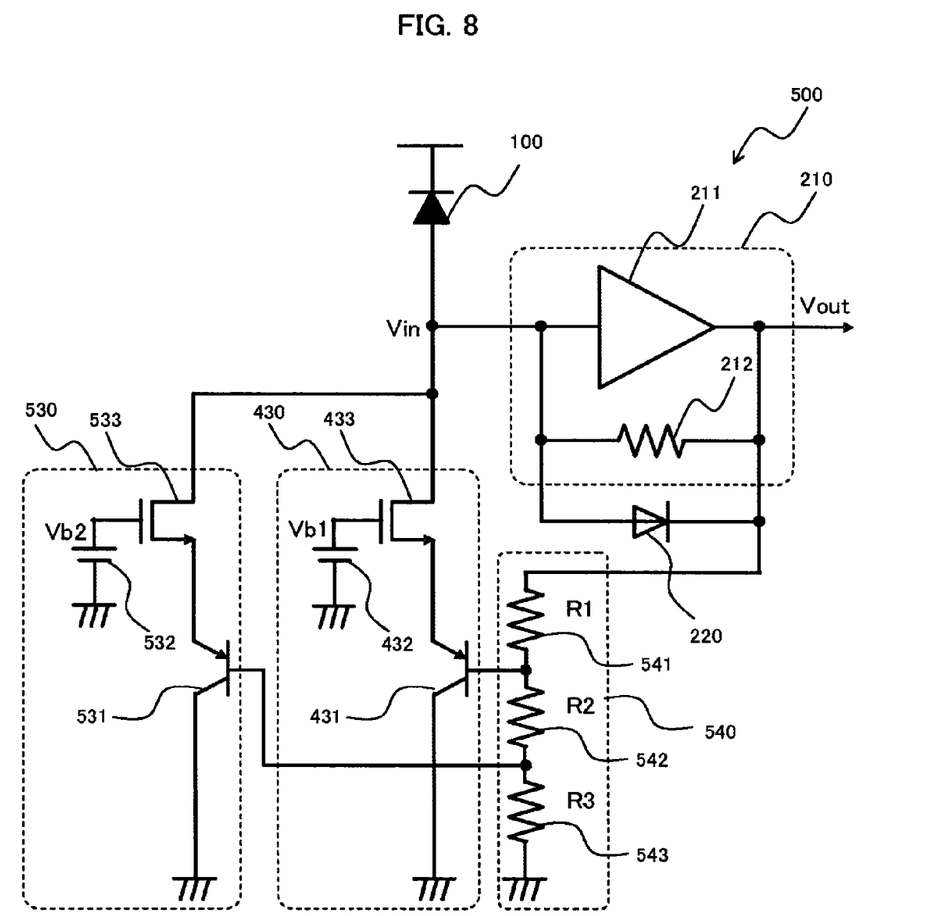
FIG. 8 is a diagram illustrating a circuit layout of a preamplifier of an optical receiver according to Embodiment 4.

As illustrated in FIG. 8, the preamplifier 500 includes a current-to-voltage conversion amplifier circuit 210, a diode 220, a first current bypass circuit 430, a second current bypass circuit 530, and a voltage level conversion circuit 540. The configuration and functions of the current-to-voltage conversion amplifier circuit 210 and the diode 220 are similar to those of Embodiment 1.

The voltage level conversion circuit 540 according to the present embodiment is configured so that resistors 541, 542, and 543 are connected in series. A voltage obtained by voltage level conversion of the output voltage Vout is output from the connecting point between the resistor 541 and the resistor 542, and a voltage obtained by voltage level conversion of the output voltage Vout is output from the connecting point between the resistor 542 and the resistor 543. The voltage output from the connecting point between the resistor 541 and the resistor 542 and the voltage output from the connecting point between the resistor 542 and the resistor 543 are voltages obtained by level conversion of the output voltage Vout of the current-to-voltage conversion amplifier circuit 210 at mutually different ratios.

The first current bypass circuit 430 and the second current bypass circuit 530 are circuits of the same configuration as the current bypass circuit 330 according to Embodiment 2, and are connected in parallel to each other to the input terminal of the current-to-voltage conversion amplifier circuit 210. The voltage output from the connecting point between the resistors 541 and 542 is input into the base terminal of a PNP transistor 431 of the first current bypass circuit 430, and the voltage output from the connecting point between the resistors 542 and 543 is input into the base terminal of a PNP transistor 531 of the second current bypass circuit 530. Consequently, the first current bypass circuit 430 and the second current bypass circuit 530 turn on when the output voltage Vout of the current-to-voltage conversion amplifier circuit 210 falls below mutually different values.

According to this configuration, it becomes possible to switch the conversion gain in four stages, and it becomes possible to make the output voltage variation versus photocurrent more linear.

As described above, according to the present embodiment, the first current bypass circuit 430 and the second current bypass circuit 530 are connected in parallel to each other to the input terminal of the current-to-voltage conversion amplifier circuit 210, and voltages at mutually different levels output from the voltage level conversion circuit 540 are input into the first current bypass circuit 430 and the second current bypass circuit 530, respectively. Consequently, by switching the conversion gain in four stages and making the output voltage variation versus photocurrent more linear, waveform distortion of the output voltage can be further reduced.

Embodiment 5

Embodiment 5 of the present disclosure will be described in detail with reference to the drawings.

The configuration of an optical communication system 1 and an OLT 10 in Embodiment 5 of the present disclosure is the same as that of Embodiment 1. Since the configuration of a preamplifier 600 provided in the optical receiver 11 of the OLT 10 differs from that of Embodiment 1, the configuration of the preamplifier 600 will be described using FIG. 9.

Figure 9:
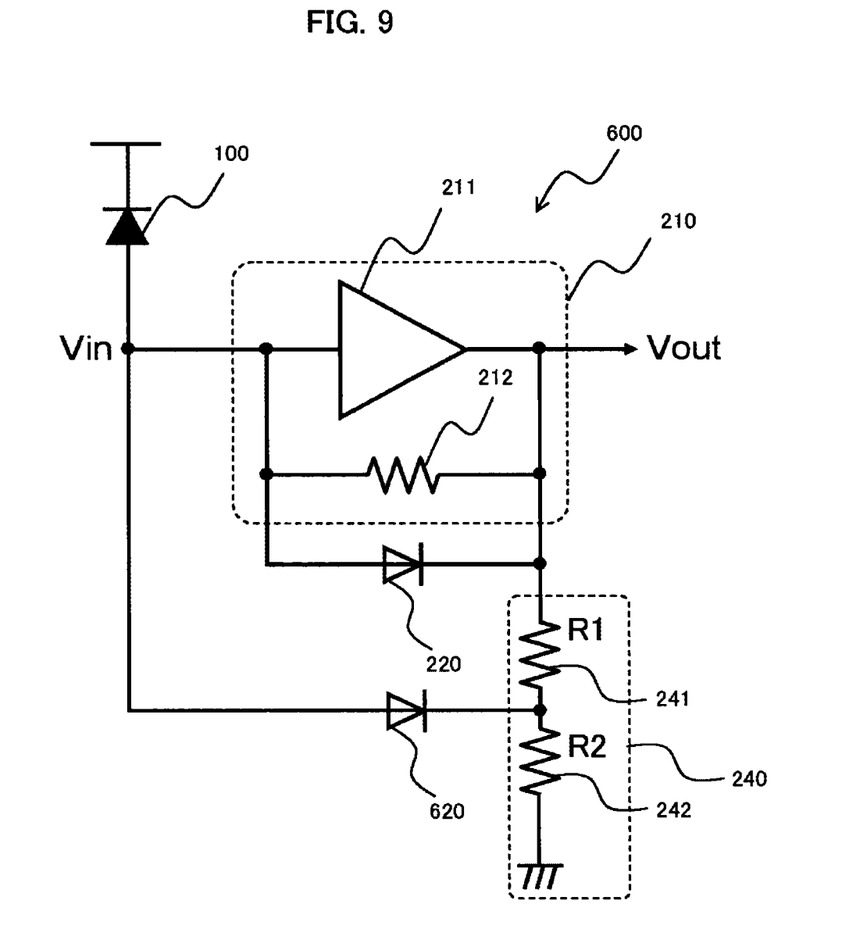
FIG. 9 is a diagram illustrating a circuit layout of a preamplifier of an optical receiver according to Embodiment 5.

As illustrated in FIG. 9, the preamplifier 600 includes a current-to-voltage conversion amplifier circuit 210, a diode 220, a voltage level conversion circuit 240, and a diode 620. The configuration and functions of the current-to-voltage conversion amplifier circuit 210, the diode 220, and the voltage level conversion circuit 240 are similar to those of Embodiment 1.

The diode 620 is the same as the diode 220, but in this case functions as a current bypass circuit. The anode of the diode 620 is connected to the input of the current-to-voltage conversion amplifier circuit 210. Also, the cathode of the diode 620 is connected to the connecting point between the resistor 241 and the resistor 242. In other words, voltage of the cathode of the diode 620 is a voltage value obtained by the voltage level conversion circuit 240 performing level conversion on the output voltage Vout.

Whereas the diode 220 turns on when the output voltage Vout exceeds Vth1 indicated in formula (1) described earlier, the diode 620 turns on when the output voltage Vout exceeds Vth7 indicated in formula (7) below.

$$\text{Vth7}=(R1+R2)/R2\times(\text{Vin}-\text{Vth3}) \qquad (7)$$

In other words, the threshold voltage Vth7 at which the diode 620 turns on is higher than the threshold voltage Vth1 at which the diode 220 turns on, and the diode 620 turns on at a lower optical signal level (intensity of photocurrent). Thus, similarly to the case of providing a current bypass circuit in the other embodiments, it becomes possible to make the overall slope of the variation of the output voltage versus photocurrent more linear, and it becomes possible to improve waveform distortion.

As described above, according to the present embodiment, the diode 620 is connected between the input terminal of the current-to-voltage conversion amplifier circuit 210 and the voltage level conversion circuit 240, and the diode 620 is made to function as a bypass circuit. Consequently, with a simple configuration, it is possible to switch the conversion gain in three stages and make the output voltage variation versus photocurrent more linear, and waveform distortion of the output voltage may be reduced.

Working Example

Figure 10:
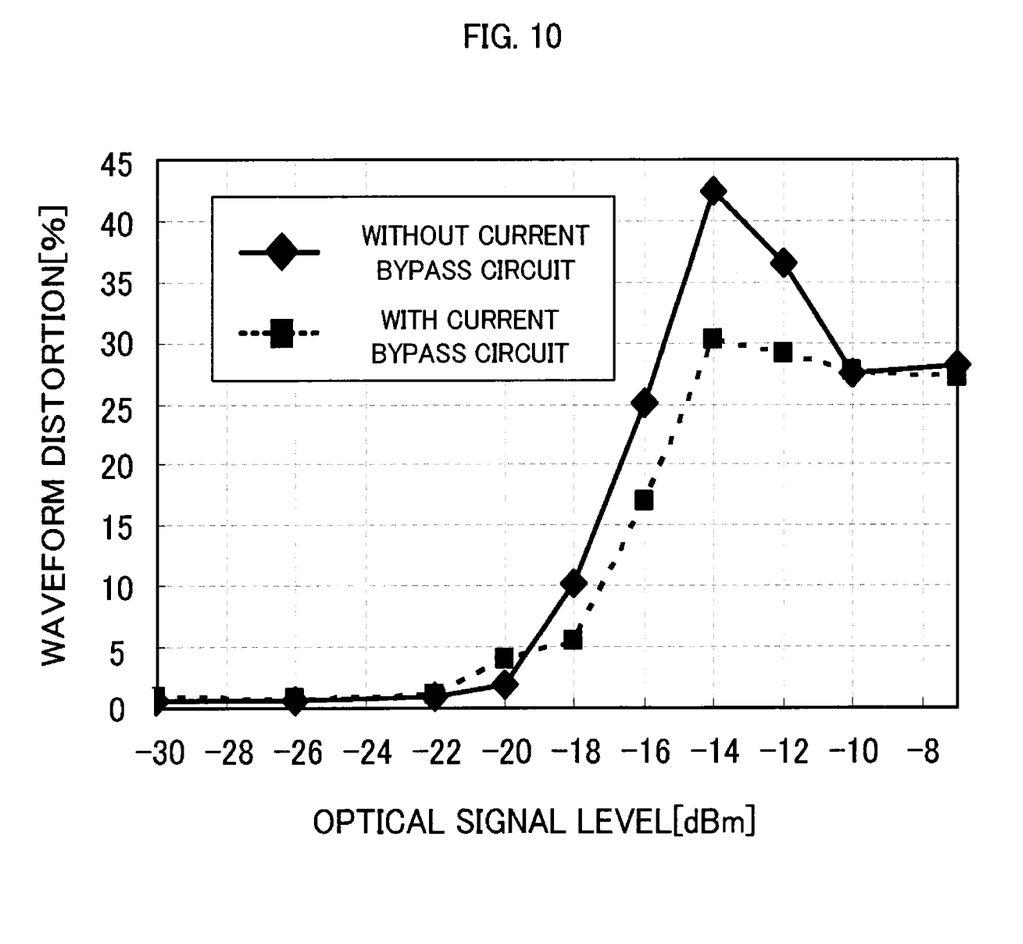
FIG. 10 is a diagram illustrating evaluation results for output voltage waveform distortion.

Results from evaluating the waveform distortion improvement effects of the present disclosure are illustrated in FIG. 10. In the configuration of the preamplifier 300 of Embodiment 2 (with a current bypass circuit) and the configuration of the preamplifier 800 of the related art illustrated in FIG. 3 (without a current bypass circuit), a diode-connected NPN transistor and a current-to-voltage conversion gain compensating resistor connected in series were used instead of the diode 220. Also, waveform distortion was calculated using the pulse width of the received signal corresponding to the "1" level of the photocurrent.

As illustrated in FIG. 5, with the configuration of the related art, the non-linearity of the output voltage variation versus photocurrent increases at the optical signal level at which the diode 220 switches on/off. On the high optical signal level at which this non-linearity increases, a large waveform distortion is produced, and a maximum distortion of 42.5% was confirmed at an optical signal level of −14 dBm (solid line in FIG. 10). However, with the configuration of Embodiment 2, the non-linearity of the output voltage versus photocurrent is improved, and thus the waveform distortion is also improved. The waveform distortion is 30.3% at an optical signal level of −14 dBm, thus realizing up to a 12.2% improvement (broken line in FIG. 10).

In this way, the present disclosure provides a current bypass circuit that bypasses part of the current input into a current-to-voltage conversion amplifier circuit at the input stage of the current-to-voltage conversion amplifier circuit having different gains demarcated by a first threshold value of the input current. On the basis of a voltage obtained by level conversion of the output voltage of the current-to-voltage conversion amplifier circuit, whether or not to execute the bypass of the current bypass circuit is switched, and a second threshold value of the input current when switching between whether or not to execute the bypass is made to be smaller than the first threshold value. Consequently, it is possible to reduce the waveform distortion of a voltage signal output by performing current-to-voltage conversion of an input current.

Note that the present disclosure is not limited to the foregoing embodiments, and that various modifications are obviously possible within a scope that does not depart from the spirit of the present disclosure.

For example, in the foregoing embodiments, the diode 220 is connected between the input/output of the current-to-voltage conversion amplifier circuit, but instead of the diode 220, a diode-connected NPN bipolar transistor or NMOS, an NPN bipolar transistor with a bias voltage applied to the base terminal, or an NMOS with a bias voltage applied to the gate terminal may also be used.

Also, the foregoing embodiments are configured to use a PNP transistor as a current bypass circuit, but may also be configured to connect a P channel metal-oxide-semiconductor field effect transistor (PMOS) instead of a PNP transistor.

Also, in Embodiment 4, a first current bypass circuit 430 and a second current bypass circuit 530 of the same configuration as the configuration of the current bypass circuit 330 of Embodiment 2 are connected in parallel, but Embodiment 4 may also be configured so that current bypass circuits according to another embodiment are connected in parallel.

Also, although Embodiment 4 is configured so that the first current bypass circuit 430 and the second current bypass circuit 530 are connected in parallel, three or more current bypass circuits may be connected, and the bias voltage of a bias power source as well as mutually different voltages from the voltage level conversion circuit 540 may be input into each current bypass circuit. Consequently, the conversion gain may be switched in five or more stages to make the output voltage variation versus photocurrent more linear, and waveform distortion of the output voltage may be further reduced.

Also, although the foregoing embodiments are configured to convert a photocurrent output from a photodetector 100 to a voltage signal and output the converted voltage signal, the foregoing embodiments are not limited thereto, and may also be applied to an arbitrary current-to-voltage conversion amplifier circuit that accepts an input of a current signal with a large dynamic range, and outputs a voltage signal based thereon.

REFERENCE SIGNS LIST

1 Optical communication system
10 OLT
20 ONU
30 Optical star coupler
32 Optical fiber
40 External network
11 Optical receiver
100 Photodetector
200, 300, 400, 500, 600, 800 Preamplifier (Pre-AMP)
110 Limiting amplifier (LIM-AMP)
12 Optical transmitter
13 Wavelength-division multiplexing coupler
14 Transmission controller 210 Current-to-voltage conversion amplifier circuit
211 Amplifier
212 Feedback resistor
220, 620 Diode
230, 330 Current bypass circuit
430 First current bypass circuit
530 Second current bypass circuit
231, 331, 431, 531 PNP transistor
332, 432, 532 Bias power source
333, 433, 533 NMOS
240, 440, 540 Voltage level conversion circuit
241, 242, 541, 542, 543 Resistor
441 NPN transistor
442 Current source

The invention claimed is:

1. A preamplifier comprising:
a current-to-voltage conversion amplifier circuit that converts all or part of a signal current into a signal voltage, and amplifies and outputs the signal voltage;
a gain varying portion that varies a conversion gain of the current-to-voltage conversion amplifier circuit so that the conversion gain has a point of variation when an input current is equal to a first threshold value;
a current bypass circuit that bypasses part of the signal current according to the intensity of the signal current; and
a voltage level conversion circuit that outputs to the current bypass circuit a level-converted voltage obtained by level conversion of the signal voltage at a predetermined ratio;
wherein a second threshold value that is the intensity of the input current of the current-to-voltage conversion amplifier circuit when the level-converted voltage output from the voltage level conversion circuit becomes a voltage of a threshold value for switching between whether or not to execute a bypass of the current bypass circuit, is less than the first threshold value.

2. The preamplifier according to claim 1, wherein
the signal current is a photocurrent generated by photoelectric conversion of received light by a photodetector, and corresponds to the intensity of the received light, and
the current-to-voltage conversion amplifier circuit outputs the signal voltage as a received signal.

3. The preamplifier according to claim 1, wherein
the current-to-voltage conversion amplifier circuit includes a feedback resistor between an input/output of an amplifier,
the gain varying portion includes a first diode connected in parallel to the feedback resistor between the input/output of the amplifier, and
the first threshold value is the input current of the current-to-voltage conversion amplifier circuit when the value of the voltage at both ends of the first diode is a threshold voltage of the first diode.

4. The preamplifier according to claim 1, wherein
the current bypass circuit includes a PNP bipolar transistor that has an emitter connected to an input of the current-to-voltage conversion amplifier circuit, and
the level-converted voltage input into the current bypass circuit from the voltage level conversion circuit is input into a base of the PNP bipolar transistor.

5. The preamplifier according to claim 4, wherein
the current bypass circuit further includes an N channel field effect transistor including a gate biased to a predetermined potential, or an NPN bipolar transistor including a base biased to a predetermined potential, and
a source of the N channel field effect transistor or an emitter of the NPN bipolar transistor is connected to the emitter of the PNP bipolar transistor.

6. The preamplifier according to claim 3, wherein
the current bypass circuit includes a second diode, and
the level-converted voltage input into the current bypass circuit from the voltage level conversion circuit is input into a cathode of the second diode.

7. The preamplifier according to claim 1, wherein
the voltage level conversion circuit is connected in series to a plurality of resistors, and outputs a voltage divided by the plurality of resistors as the level-converted voltage.

8. The preamplifier according to claim 1, wherein
the voltage level conversion circuit includes a configuration with an NPN bipolar transistor or an N channel field effect transistor connected in series to a current source, and outputs a voltage at an input terminal of the current source as the level-converted voltage.

9. The preamplifier according to claim 1, wherein
the current bypass circuit includes a configuration with a plurality of current bypass modules of the same configuration connected in parallel to each other,
the voltage level conversion circuit respectively outputs to the plurality of the current bypass modules a plurality of the level-converted voltage obtained by level conversion at different ratios, and
each of the current bypass modules switches between whether or not to execute a bypass of the current bypass module based on the level-converted voltage.

10. An optical receiver comprising a photodetector that photoelectrically converts received light and outputs a photocurrent corresponding to the intensity of the received light, and a preamplifier that outputs a received signal based on the photocurrent, wherein
the preamplifier includes
a current-to-voltage conversion amplifier circuit that converts all or part of a signal current into a signal voltage, and amplifies and outputs the signal voltage,
a gain varying portion that varies a conversion gain of the current-to-voltage conversion amplifier circuit so that a intensity of an input current of the current-to-voltage conversion amplifier circuit being a first threshold value is treated as a point of variation,
a current bypass circuit that bypasses part of the signal current according to the intensity of the signal current, and
a voltage level conversion circuit that outputs to the current bypass circuit a level-converted voltage obtained by level conversion of the signal voltage at a predetermined ratio, wherein
a second threshold value that is the intensity of the input current of the current-to-voltage conversion amplifier circuit when the level-converted voltage output from the voltage level conversion circuit becomes a voltage of a threshold value for switching between whether or not to execute a bypass of the current bypass circuit, is less than the first threshold value.

11. An optical line terminating apparatus comprising the optical receiver of claim 10.

12. An optical communication system comprising the optical line terminating apparatus of claim 11.

* * * * *